United States Patent
Gasparik

[11] 4,250,460
[45] Feb. 10, 1981

[54] SLEW RATE CONTROL
[75] Inventor: Frank Gasparik, Indialantic, Fla.
[73] Assignee: Harris Corporation, Melbourne, Fla.
[21] Appl. No.: 7,750
[22] Filed: Jan. 30, 1979
[51] Int. Cl.³ .............................................. H03F 3/45
[52] U.S. Cl. ..................................... 330/252; 330/69
[58] Field of Search ................. 330/252, 257, 261, 69; 307/263

[56] References Cited
U.S. PATENT DOCUMENTS

| | | | |
|---|---|---|---|
| 3,401,351 | 9/1968 | Ellestad | 330/69 |
| 3,668,538 | 6/1972 | Hearn | 330/9 |
| 3,688,208 | 8/1972 | Kandiah | 307/294 X |
| 3,693,108 | 9/1971 | Iijima et al. | 330/295 |

FOREIGN PATENT DOCUMENTS 515251  10/1976  U.S.S.R. ................................. 330/252

Primary Examiner—James B. Mullins
Attorney, Agent, or Firm—Leitner, Palan, Lyman, Martin & Bernstein

[57] ABSTRACT

The slew rate of an electronic operational amplifier is maximized by inserting additional capacitance calculated according to the equation.

$$C_c = \sqrt{\frac{36 - 4w_1^2 h_{ib}^2 C_H^2}{w_1^4 h_{ib}^4 C_H^2 - 4w_1^2 h_{ib}^2}}$$

The capacitance may be connected across the amplifier current source to provide additional transient current flowing through the input differential pair and thus increase slew rate without affecting the amplifier's stability.

8 Claims, 2 Drawing Figures

SLEW RATE CONTROL

BACKGROUND OF THE INVENTION

Slew rate of operational amplifiers is defined as the maximum rate of change of the output signal in response to changes in the large input signal. Ideally, the amplifier output under large signal conditions should follow the input signal. However, limitations on the slew rate cause the amplifier output response to be slower than the rate of change of the large input signal. The greater the slew rate the more closely the output signal follows the input signal. Various techniques have been developed to increase the slew rate of operational amplifiers. Examples of such techniques are described in U.S. Pat. No. 3,668,538 issued June 6, 1972, to Hearn and U.S. Pat. No. 3,688,208 issued Aug. 29, 1972, to Kandiah.

SUMMARY OF THE INVENTION

The present invention provides a new and useful technique for increasing the slew rate of an operational amplifier. To increase slew rate without impairing amplifier stability, additional capacitance is added to the amplifier circuit. This capacitance may be connected in parallel across the current source. The value of this capacitance is calculated according to the equation.

$$C_c = \sqrt{\frac{36 - 4w_1^2 h_{ib}^2 C_H^2}{w_1^4 h_{ib}^4 C_H^2 - 4w_1^2 h_{ib}^2}}$$

DETAILED DESCRIPTION OF THE PREFERRED EMBODIMENTS

Figure 1:
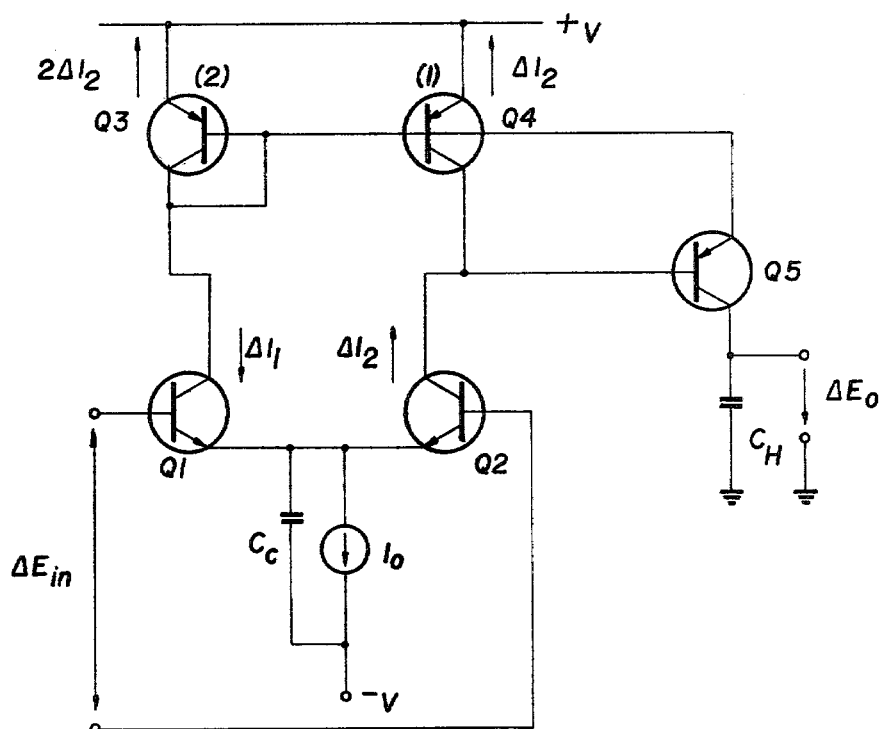
FIG. 1 represents a schematic diagram of a conventional operational amplifier of the differential type to which has been added the additional capacitance according to the invention, which figure should be consulted for an understanding of the mathematical derivation of the invention set out in the description of the preferred embodiment of the invention.

Referring to FIG. 1, the amount of current available to charge the compensating capacitor $C_H$ is limited in a conventional operational amplifier to a constant value, proportional to current $I_o$ in current source. In turn, the current $I_o$ produced by the constant current source defines the transconductance of a differential input and thus the bandwidth of the amplifier. To increase the slew rate, the $I_o$ current has to be increased. If this current is increased, then the amplifier compensating capacitor $C_H$ must be increased to insure amplifier stability. However, an increase in the compensating capacitance value limits amplifier slew rate. To increase the amplifier slew rate without impairing amplifiers stability, an additional capacitance calculated according to the equation $$C_c = \sqrt{\frac{36 - 4w_1^2 h_{ib}^2 C_H^2}{w_1^4 h_{ib}^4 C_H^2 - 4w_1^2 h_{ib}^2}}$$

is provided.

To understand my invention, one should consider first the small-signal behavior of a feedback operational amplifier whose gain function contains a single pole. The gain-bandwidth product of such system is constant and is equal to the small signal bandwidth, i.e.:

$$GBW = \frac{1}{h_{ib}C_H} = \frac{g_m}{C_H} = \frac{kT}{q} \times \frac{1}{I_{o/2}} \times \frac{1}{C_H} = \frac{2kT}{q} \times \frac{1}{I_o C_H} = BW$$

where
k = Boltzman constant;
T absolute temperature (°Kelvin); and
q = charge.

The small signal bandwidth determines the highest frequency, which an amplifier will pass without attenuation. The relation between frequency response and time response is expressed in the definition of rise time:

$$t_r = \frac{2.22}{w_{-3dB}} = \frac{0.35}{f_{-3dB}}$$

where $W_{-3dB}$ is the $-3$dB radial frequency, or the pole of an amplifier.

Figure 2:
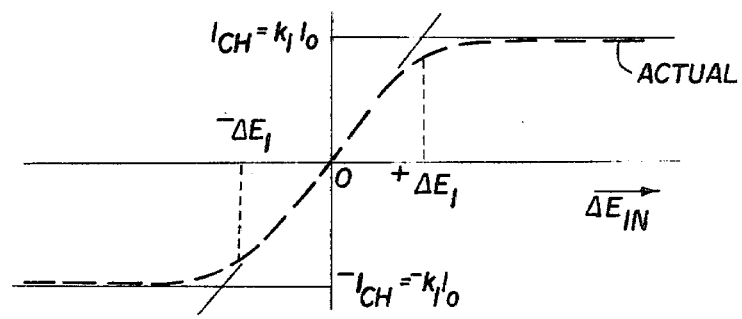
FIG. 2 is a graphical representation of the amplifier transconductance.

The rise time is the fastest rate of output response under small-signal input excitation. Knowing that the GBW product (for open loop gain $A_{OL}$) is:

$$GBW = A_{OL} \times w_{-3dB} = \frac{2kT}{q} \times \frac{1}{I_o C_H} = \text{Constant;}$$

for a given $A_{OL}$, $I_o$, $C_H$, the bandwidth $w_{-3dB}$ will be limited to a finite value. Thus the fastest rate of the output signal is limited also. It is noted that the small signal input excitation is restricted to a voltage range where an amplifier still operates in the linear mode. As can be seen from FIG. 2, under large signal conditions, the transconductance of an amplifier is no longer a linear function of input signal, $|E_{in}| > E_1$.

The maximum available current $I_{CH}$ determines the highest rate of voltage change $|\Delta E_o|$ at the compensating capacitance $C_H$. It is called slew rate:

$$SR = \left| \frac{\Delta E_o}{\Delta t} \right| = \frac{I_{CH}}{C_H} = \frac{k_1 I_o}{C_H}$$

Stability considerations do not allow an increase of the slew rate, SR, by increasing $I_o$ and/or decreasing the compensating capacitance $C_H$.

According to the teachings of the present invention, the operational amplifier is provided with additional transient current by connecting capacitance, $C_c$, across the amplifier current source, $I_o$. The value of $C_c$ is determined in such a way that the slew rate of an amplifier equals or exceeds the slew rate of the output signal under small signal conditions, thereby increasing the amplifier slew rate under large signal conditions above the maximum slew rate determined by the amplifier small signal characteristics.

Returning to the amplifier illustrated in FIG. 1, transistors $Q_1$–$Q_5$ represent the basic operational components of a conventional differential type operational amplifier. The compensating capacitance $C_H$ is selected to determine the basic amplifier bandwidth. In accordance with the teachings of the present invention, the capacitance $C_c$ is connected across the current source $I_o$. The invention is best described with reference to a mathematical derivation as follows:
Let:
- $\Delta I_1$ = the incremental current flow in the collector-emitter path of transistor $Q_1$.
- $\Delta I_2$ = the incremental current flow in the collector-emitter path of transistor $Q_2$.
- $\Delta E_{in}$ = the incremental portion of the input voltage.
- $\Delta E_o$ = the incremental portion of the amplifier output voltage.

$$h_{ib} = \frac{\alpha T}{I_o} = \text{common base hybrid parameter.}$$

The incremental collector-emitter current through transistor $Q_1$ can be defined by the equation:

$$\Delta I_1 = \frac{\Delta E_{in}}{h_{ib} + \frac{h_{ib}}{-sC_ch_{ib}}} = \frac{\Delta E_{in}/h_{ib}}{2 + sC_ch_{ib}}(1 + sC_ch_{ib}) = \frac{\Delta E_{in}}{2h_{ib}} \times \frac{1 + sC_ch_{ib}}{\frac{1 + sC_ch_{ib}}{2}} \quad (1)$$

The incremental collector-emitter current through transistor $Q_2$ can be defined by the equation:

$$\Delta I_2 = \frac{\Delta I_1/sC_c}{h_{ib} + \frac{1}{sC_c}} = \frac{\Delta I_1}{1 + sC_ch_{ib}} = \frac{\Delta E_{in}}{2h_{ib}} \times \frac{1}{\frac{1 + sC_ch_{ib}}{2}} \quad (2)$$

The incremental amplifier output voltage, $\Delta E_o$, is given by:

$$\Delta E_o = \frac{\Delta I \text{ out}}{sC_h} = \frac{2\Delta I_2 + \Delta I_1}{sC_H} \quad (3)$$

Substituting equations (1) and (2) for $\Delta I_1$ and $\Delta I_2$, respectively, in equation (3), the output voltage is given by:

$$\Delta E_o = \left[\frac{\Delta E_{in}}{h_{ib}} \times \frac{1}{\frac{1 + sC_ch_{ib}}{2}} + \frac{\Delta E_{in}}{2h_{ib}} \frac{1 + sC_ch_{ib}}{\frac{1 + sC_ch_{ib}}{2}}\right] \times \frac{1}{sC_H} \quad (4)$$

$$= \frac{\Delta E_{in}}{2h_{ib}} \times \frac{2 + 1 + sC_ch_{ib}}{1 + sC_ch_{ib}/2} \times \frac{1}{sC_H} = \frac{3}{2} \times \frac{\Delta E_{in}}{h_{ib}} \times \frac{1 + s\frac{1}{3}C_ch_{ib}}{1 + s\frac{1}{2}C_ch_{ib}} \times \frac{1}{sC_H}$$

since $s = jw$, the gain equation for unity gain becomes:

$$\frac{\Delta E_o}{\Delta E_{in}} = 3 \left|\frac{1 + \left(\dfrac{w^2C_c^2h_{ib}^2}{9}\right)}{1 + \left(\dfrac{w^2C_c^2h_{ib}^2}{4}\right)}\right| \times \frac{1}{wh_{ib}C_H} = 1 \quad (5)$$

Equation (5) represents the limiting factor for maximum slew rate, when the output signal $\Delta E_o$ follows input signal $\Delta E_{in}$ (both signals expressed in incremental vector form). Equation (5) may now be used to calculate the value of $C_c$, the additional capacitance needed to increase slew rate under large signal conditions.

Equation (6) is developed directly from equation (5) by squaring both sides of the equation and setting the radial frequency $w = w_1$ (the bandwidth under large signal conditions) to give:

$$9\left(\frac{1 + w_1^2\left(\frac{1}{9}\right)C_c^2h_{ib}^2}{1 + w_1^2(\frac{1}{4})C_c^2h_{ib}^2}\right) \times \frac{1}{w_1^2h_{ib}^2C_H^2} = 1 \quad (6)$$

Equation (6) is now solved for the additional capacitance, $C_c$ as follows:

$$9 + w_1^2C_c^2h_{ib}^2 = [1 + w_1^2(\tfrac{1}{4})C_c^2h_{ib}^2] \times [w_1^2h_{ib}^2C_H^2] \quad (7)$$

$$36 + 4w_1^2C_c^2h_{ib}^2 = 4w_1^2h_{ib}^2C_H^2 + w_1^4h_{ib}^4C_H^2C_c^2 \quad (8)$$

$$w_1^4h_{ib}^4C_H^2C_c^2 - 4w_1^2C_c^2h_{ib}^2 = 36 - 4w_1^2h_{ib}^2C_H^2 \quad (9)$$

$$C_c^2[w_1^4h_{ib}^4C_H^2 - 4w_1^2h_{ib}^2] = 36 - 4w_1^2h_{ib}^2C_H^2 \quad (10)$$

$$C_c^2 = \frac{36 - 4w_1^2h_{ib}^2C_H^2}{w^4h_{ib}^4C_H^2 - 4w_1^2h_{ib}^2} \quad (11)$$

$$|C_c| = \sqrt{\frac{36 - 4w_1^2h_{ib}^2C_H^2}{w_1^2h_{ib}^4C_H^2 - 4w^2h_{ib}^2}} = \frac{2}{w_1h_{ib}}\sqrt{\frac{9 - w_1^2h_{ib}^2C_H^2}{w_1^2h_{ib}^2C_H^2 - 4}} \quad (12)$$

For $C_c$ real the following condition has to be satisfied:

$$2 < w_1h_{ib}C_H < 3$$

As previously described:

$$BW = \frac{1}{h_{ib}C_H} = W_T$$

Therefore:

$$2 < \frac{w_1}{w_2} < 3$$

The highest radial frequency $w_1$ will exceed the small signal BW by at least a factor of two and by a maximum up to a factor of three. So for a given $h_{ib}$, $C_H$ and desired $w_1$ the necessary $C_c$ can be calculated.

Operational amplifiers are often fabricated using integrated circuit technology. An integrated circuit operational amplifier incorporating the features of the present invention will advantageously include the compensating capacitance integrated with the integrated amplifier. Either of two manufacturing processes are conventionally used to fabricate integrated amplifiers. These are termed, respectively, the junction isolation process and the dielectric isolation process. Proper operation of the invention requires accurate implementation of the capacitance to thereby produce a capacitance of the required size. As will be recalled, the compensating capacitance, $C_c$, is according to the teachings of this invention, connected across the current source, $I_o$. In the case of an amplifier fabricated according to the junction isolation process, there exists a parasitic capacitance across the current source, which capacitance varies over a broad range as a function of wafer thickness and substrate bias. This variation of parasitic capacitance directly affects the value of the compensating capacitance and, therefore, capacitance external to the integrated structure would have to be utilized in order to offset the variations in parasitic capacitance value and develop a shunt capacitance across the current source which is of the required value according to the teachings of the present invention.

The dielectric isolation process may be advantageously used to produce the slew rate control circuit of this invention with the compensating capacitance fully integrated with the amplifier structure. With the dielectric isolation process, the integrated current source is produced within a semiconductor island dielectrically isolated from the device substrate. The semiconductor island capacitance, which can function as the compensating capacitance, depends only on island size and the thickness of the dielectric isolation. Thus, compensating capacitance of desired characteristics can be integrally formed with the current source by controlling, during the fabrication process, the island size and dielectric thickness. The resulting structure is a fully integrated slew rate control circuit according to the invention described hereinbefore without external components.

I claim:

1. In an operational amplifier circuit comprising a differential amplifier means providing an output current in response to a differential input voltage, a current source, and a compensating capacitance means receiving said output current, the improvement comprising slew rate control means comprised of additional capacitance means electrically connected to said differential amplifier means, said additional capacitance, $C_c$, being dimensioned according to the following equation:

$$C_c = \sqrt{\frac{36 - 4w_1^2 h_{ib}^2 C_H^2}{w_1^4 h_{ib}^4 C_H^2 - 4w_1^2 h_{ib}^2}}$$

where $w_1$ = amplifier bandwidth set equal to the maximum small signal bandwidth $C_H$ = compensating capacitance and $h_{ib}$ = common base hybrid parameter, whereby the amplifier slew rate is raised to its maximum slew rate determined by its small signal response.

2. The operational amplifier circuit of claim 1 wherein said additional capacitance means having a valve $C_c$ is a capacitor connected in parallel with the current source of said amplifier circuit.

3. In an operational amplifier circuit comprising a differential amplifier means producing an output current in response to a differential input voltage, a current source and a compensating capacitance receiving said output current, the improvement comprising:

capacitor means of a selected value for increasing the differential input transient current to cause the amplifier slew rate under large signal conditions to equal or exceed the amplifier slew rate under small signal conditions.

4. The operational amplifier of claim 3 wherein said capacitance means to increase transient current comprises capacitance means, $C_c$, dimensional according to the equation:

$$C_c = \sqrt{\frac{36 - 4w_1^2 h_{ib}^2 C_H^2}{w_1^4 h_{ib}^4 C_H^2 - 4w_1^2 h_{ib}^2}}$$

where $w_1$ = amplifier bandwidth set equal to the maximum small signal bandwidth $h_{ib}$ = common base hybrid parameter $C_H$ = compensating capacitance.

5. The operational amplifier of claim 4 wherein said capacitance means, $C_c$, is comprised of a capacitor electrically connected in parallel with said current source.

6. A method for increasing the slew rate of an operational amplifier, said amplifier including a differential amplifier means producing an output signal in response to a differential input signal, a current source and a compensating capacitance, said method comprising the step of:

supplying additional capacitance having a selected value which is a function of amplifier parameters to increase the amplifier transient current such that the amplifier slew rate is increased whereby the rate of change of the output signals under large signal conditions equals or exceeds the rate of change of the output signal under small signal conditions.

7. The method of claim 6 wherein said additional capacitance, $C_c$, is calculated according to the equation:

$$C_c = \sqrt{\frac{36 - 4w_1^2 h_{ib}^2 C_H^2}{w_1^4 h_{ib}^4 C_H^2 - 4w_1^2 h_{ib}^2}}$$

where:

$w_1$ = maximum small signal bandwidth $h_{ib}$ = common base hybrid parameter $C_H$ = compensating capacitance.

8. The method of claim 6 wherein the amplifier parameters upon which said additional capacitance depends includes its maximum small signal bandwidth and the value of said compensating capacitance.

* * * * *

UNITED STATES PATENT AND TRADEMARK OFFICE
CERTIFICATE OF CORRECTION

PATENT NO. : 4,250,460
DATED : February 10, 1981
INVENTOR(S) : Frank Gasparik

It is certified that error appears in the above—identified patent and that said Letters Patent is hereby corrected as shown below:

Column 2, line 24, delete "$^W$-3dB" and insert therefor -- $^W$-3dB --.

Column 2, line 24, delete "radial" and insert therefor -- radian --.

Column 4, line 38, delete "$^W$T" and insert therefor -- $W_2$ --.

Column 4, line 46, delete "radial" and insert therefor -- radian --.

Signed and Sealed this

Ninth Day of June 1981

[SEAL]

Attest:

RENE D. TEGTMEYER

Attesting Officer

Acting Commissioner of Patents and Trademarks